United States Patent [19]
Nishino et al.

[11] Patent Number: 4,843,446
[45] Date of Patent: Jun. 27, 1989

[54] SUPERCONDUCTING PHOTODETECTOR

[75] Inventors: Toshikazu Nishino, Kawasaki; Ushio Kawabe, Tokyo; Shinya Kominami, Kokubunji, all of Japan

[73] Assignee: Hitachi, Ltd., Tokyo, Japan

[21] Appl. No.: 246,926

[22] Filed: Sep. 19, 1988

Related U.S. Application Data

[63] Continuation of Ser. No. 15,029, Feb. 17, 1987, abandoned.

[30] Foreign Application Priority Data

Feb. 27, 1986 [JP] Japan .................. 61-40241
Jul. 25, 1986 [JP] Japan ................ 61-173641

[51] Int. Cl.$^4$ ............................................ H01L 27/14
[52] U.S. Cl. ..................... 357/30; 357/23.3; 357/16
[58] Field of Search ............... 357/30 L, 30 D, 30 P, 357/30 I, 30 E, 5, 23.3, 16

[56] References Cited

U.S. PATENT DOCUMENTS

| | | | |
|---|---|---|---|
| 4,224,630 | 9/1980 | Kroger | 357/5 |
| 4,424,525 | 1/1984 | Mimura | 357/4 |
| 4,497,974 | 2/1985 | Deckman et al. | 357/30 L |
| 4,589,001 | 5/1986 | Sakai et al. | 357/5 |
| 4,598,305 | 7/1986 | Chiang et al. | 357/23.7 |
| 4,647,954 | 3/1987 | Graf et al. | 357/4 |

FOREIGN PATENT DOCUMENTS

| | | | |
|---|---|---|---|
| 57-106186 | 7/1982 | Japan | 357/5 |
| 57-159074 | 10/1982 | Japan | 357/5 |
| 58-141582 | 8/1983 | Japan | 357/5 |

OTHER PUBLICATIONS

Fowler et al, I.B.M. Tech. Discl. Bull., vol. 13, Jun. 1970.

Primary Examiner—Martin H. Edlow
Attorney, Agent, or Firm—Antonelli, Terry & Wands

[57] ABSTRACT

A photodetector which operates at a cryogenic temperature by utilizing superconductivity is disclosed. A plurality of mutually spaced-apart superconducting layers are formed in such a manner as to be in contact with a semiconductor layer at least one of the surfaces of which is an incidence surface of light, and means capable of accumulating carriers in the semiconductor layer is disposed.

A photodetector having high performance can thus be obtained and can be used as an interface of a system at a cryogenic temperature.

24 Claims, 8 Drawing Sheets

SUPERCONDUCTING PHOTODETECTOR

This application is a continuation of application Ser. No. 015,029, filed Feb. 17, 1987, abandoned.

BACKGROUND OF THE INVENTION

This invention relates generally to superconducting photodetectors operating at a cryogenic temperature and more particularly, to a superconducting photodetector suitable for converting a detected optical signal to an electric signal.

Heretofore known photodetectors using a superconductor operating at a cryogenic temperature include a photodetector using a Josephson device having a microbridge structure as described, for example, in IEEE Transaction on Magnetics, MAG-17, No. 1 (1981) pp. 88–91 and a photodetector using a sandwich type Josephson device utilizing the quasi-particle injection effect into a superconductor, as described, for example, in Japanese Patent Laid-Open No. 30114/1985.

The prior art technique described above detects light by utilizing the change of the electrical characteristics of the Josephson device that occurs when the light is radiated to a superconductor and the quasi-particles (electrons or holes) excited thereby in the superconductor exert influences upon thin film superconductors constituting the Josephson device.

The Josephson device described above is a two-terminal device that has only two terminals and the device itself does not have any function of signal amplification. The change of the electrical characteristics of the Josephson device occurring due to radiation of light, that is, an output signal, is smaller than a gap voltage $\Delta$ of the superconductor when converted to a voltage. Accordingly, a device for amplifying the output signal of the photodetector must be disposed in order to transmit the signal to a circuit constituted by the Josephson device or a superconducting transistor. Another characterizing feature of the device utilizing the quasi-particles is that the OFF operation time of the photodetector is incomparably greater than its ON operation time and hence the circuit operation becomes complicated.

Furthermore, Physical Review, B, Vol. 18 (1978) pp. 6036–6040 discusses the photodetectors using superconductors.

SUMMARY OF THE INVENTION

It is an object of the present invention to provide a superconducting photodetector that operates at a cryogenic temperature and has excellent electrical characteristics.

In accordance with the present invention, there is provided a superconducting photodetector comprising two superconducting electrodes which fall each other through a semiconductor with a gap $d_N$ which is selected from the range of 5 to 20 times the coherence length $\xi_n$ in the semiconductor in order to form weak links of superconducting wave functions between the two superconducting electrodes and having means for changing the degree of the weak links and the carrier concentration in the semiconductor (such as a gate electrode disposed on the semiconductor through an insulation film). The photodetector detects the light when the light is radiated to the semiconductor portion.

The superconducting photodetector in accordance with the present invention is used while being cooled to a liquid helium temperature (4.2 K) or a cryogenic temperature close thereto. An n-type or p-type impurity is doped into the semiconductor. When the semiconductor is Si or GaAs, for example, an impurity is doped in a concentration of $1 \times 10^{16}$ to $1 \times 10^{19}$ cm$^{-3}$ and when the semiconductor is InAs, InSb, InP or the like, the impurity is doped in a concentration of $1 \times 10^{15}$ to $1 \times 10^{18}$ cm$^{-3}$. Although the temperature of use of the superconducting photodetector is extremely low and almost no impurities are activated and do not serve as donors or acceptors of the carries, the magnitude of the superconducting current flowing between the two superconducting electrodes of the superconducting photodetector can be changed by radiating the light to the photodetector and increasing the carrier due to the excitation. In this case, a large change of the superconducting current can be obtained from a weak incidence signal by applying a voltage (1 mV $\sim$ 10V or $-1$ mV $\sim$ $-10$ V) to a gate electrode, for example, as a third electrode in order to accumulate in advance a predetermined quantity ($1 \times 10^{16} \sim 1 \times 10^{18}$ cm$^{-3}$) of carries in the semiconductor.

The object of the present invention can be accomplished, too, by introducing an impurity having a deep level into the semiconductor and by radiating the light while a gate voltage is applied so that the semiconductor accumulates the carrier. In this case, the carrier due to the impurity of the deep level is excited by the light and contributes to the conduction so that the change of superconductivity can be obtained.

In the superconducting photodetector of the present invention described above, the existence of the gate electrode and the gate voltage (10 mV $\sim$ 10 V) applied to the gate electrode as means for accumulating a predetermined quantity of carriers in the semiconductor play an important role in order to efficiently detect the light and to obtain a large output signal. In other words, the superconducting photodetector has a three-terminal structure and since its output signal is at substantially the same level as an operation voltage level of a Josephson device of a superconducting transistor, any other devices for amplification are not necessary and the circuit design as well as fabrication become easy.

As described above, the present invention can accomplish a photodetector which operates at a cryogenic temperature. The photodetector of the present invention has high detection efficiency and high output voltage so that it does not require any devices for signal amplification. Accordingly, the number of circuit components can be reduced and the integration density can be improved. In accordance with the present invention, signal transmission between a system under a cryogenic temperature state and a system under a room temperature state by optical signals becomes possible, and since thermal inflow into the system under the cryogenic state can be reduced, the cooling cost of the system can be reduced, too.

These and other objects and many novel features of this invention will be readily appreciated from the following detailed description when taken in connection with the accompanying drawings.

DESCRIPTION OF THE PREFERRED EMBODIMENTS

[Embodiment 1]

Figure 1:
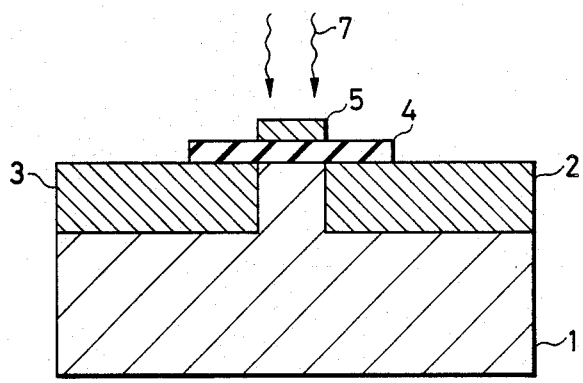
FIG. 1 is a sectional view showing part of a superconducting photodetector in accordance with a first embodiment of the present invention.
Figure 2:
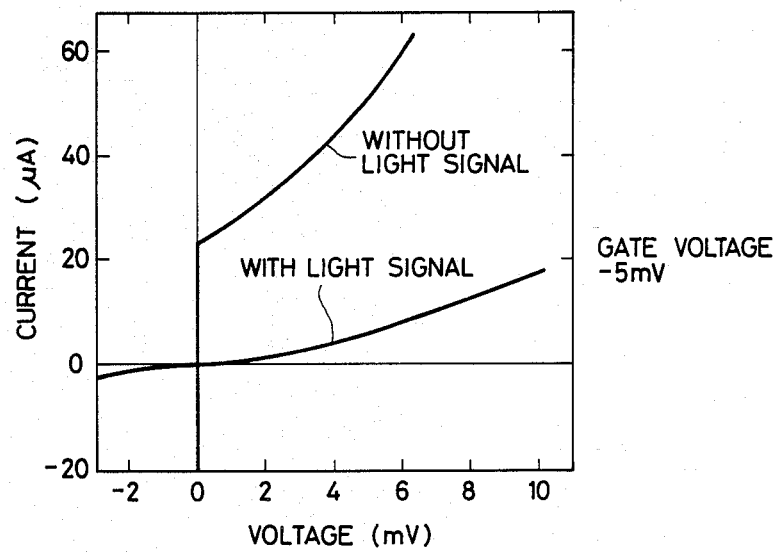
FIG. 2 is a diagram showing the electrical characteristics of the first embodiment.

In FIG. 1, a semiconductor 1 is made of an Si single crystal substrate containing a p-type impurity (e.g. B) in a concentration of $1 \times 10^{18}$ cm$^{-3}$ and its crystal orientation is (100). Superconducting electrodes 2 and 3 each consisting of an about 150 nm-thick Nb film are formed on the semiconductor substrate 1 by DC magnetron sputtering using an Ar gas and worked in a width of 10 μm by reactive plasma etching using a CF$_4$ gas. Next, an about 60 nm-thick insulation film 4 is deposited by chemical vapor deposition (CVD) and worked by reactive plasma etching using the CF$_4$ gas. Finally, a gate electrode 5 consisting of a 20 nm-thick Nb film is formed, thereby obtaining the superconducting photodetector of this embodiment. Though the distance between the superconducting electrodes 2 and 3 is preferably about 0.2 μm or below, it may be greater than the value described above when the carrier mobility in the semiconductor 1 is greater than in Si.

When an optical signal 7 is applied (or is incident) to the photodetector described above, the electrical characteristics between the two superconducting electrodes 2 and 3 of the photodetector change, and particularly when a negative voltage is applied in advance, superconducting coupling occurs between the superconducting electrodes 2 and 3. If coupling is too strong, the superconductive current flows irrespective of the incidence of the optical signal and if it is too weak, the superconductive current does not flow even when the optical signal is incident. Accordingly, detection of light can be made efficiently by storing in advance a minimum necessary quantity (e.g. $1 \times 10^{16}$ to $1 \times 10^{18}$ cm$^{-3}$) of carries. This means that the intensity of the light source can be reduced. In other words, since a small light source can be used, high density packaging of a computer or the like using a Josephson device be accomplished more easily. The output voltage of the superconducting photodetector described above is from about 2 to about 3 mV and hence the Josephson device or other superconducting transistors can be driven directly without using any other amplification devices.

[Embodiment 2]

Figure 3:
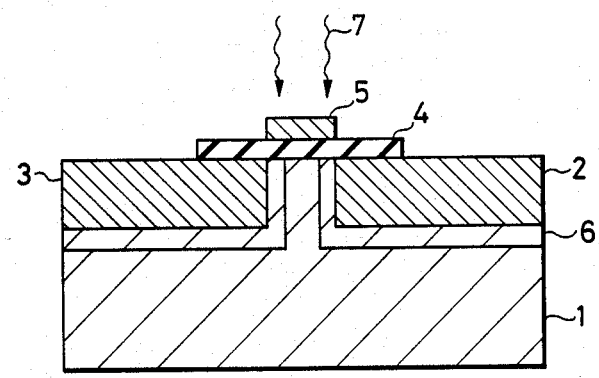
FIG. 3 is a sectional view showing part of a second embodiment of the present invention.
Figure 4:
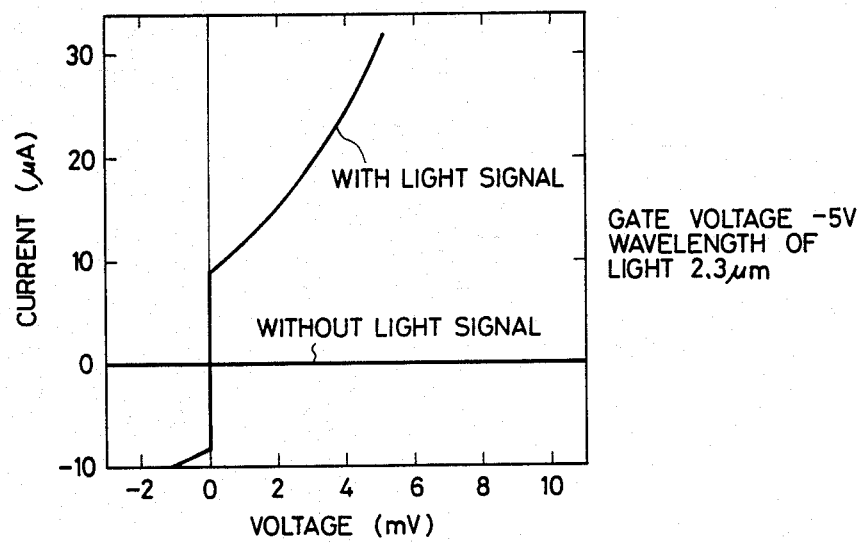
FIG. 4 is a diagram showing the electrical characteristics of the second embodiment.

The second embodiment of the present invention will be described with reference to FIGS. 3 and 4. The fundamental structure shown in the sectional view of FIG. 3 is the same as that of the first embodiment but the difference lies in that an impurity injection portion 6 formed by ion implantation of P in a concentration of $1 \times 10^{19}$ cm$^{-3}$ is interposed between the semiconductor substrate 1 and the superconducting electrodes 2 and 3 and a deep level is formed by adding B into the semiconductor substrate 1 and diffusing $5 \times 10^{17}$ cm$^{-3}$ of In within the depth range of about 100 nm. When the superconducting photodetector is cooled to a liquid helium temperature (4.2 K) and infrared light of a wavelength of 2 to 7 μm is radiated thereto, the electrical characteristics between the two superconducting electrodes 2 and 3 of the superconducting photodetector change as shown in FIG. 4 by strongly accumulating the semiconductor 1 by applying a voltage of about −5V to the gate electrode 5. Thus, the optical signal can be converted to an electric signal.

Though Si is used for the semiconductor substrate 1 in the first and second embodiments described above, the same effect can be obtained by use of GaAs, InAs, InSb, InP, Ge, or the like, in place of Si. It is possible to use NbN, MoN, Mb$_3$Al, Nb$_3$Si, V$_3$Si, Nb$_3$Sn, Pb alloys, or the like, in place of Nb for the superconductor. Additionally, the thickness of the gate electrode 5 must be selected in such a manner that the incident light can reach the semiconductor.

[Embodiment 3]

Figure 5:
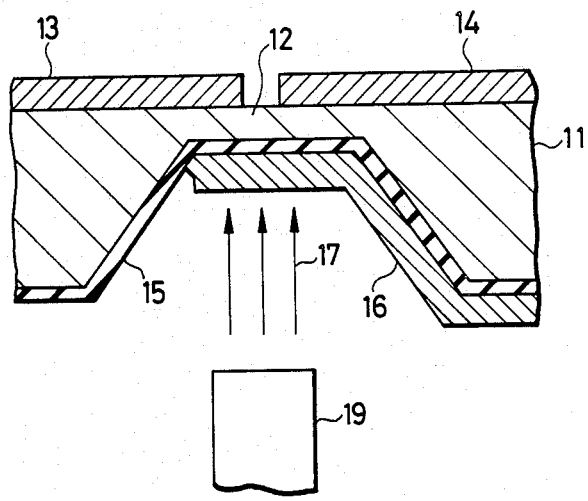
FIG. 5 is a schematic view showing a third embodiment of the present invention.

The object of the present invention can be accomplished when means for radiating the input light is disposed on the reverse of the semiconductor substrate. The third embodiment of the present invention shown in FIG. 5 represents the example which uses an Si single crystal film 12 obtained by anisotropically etching the Si (100) single crystal substrate 11 from its bottom surface as the semiconductor. In this embodiment, the superconducting electrodes 13 and 14 are disposed on the surface of the Si single crystal film 12 and form superconducting weak coupling through the Si single crystal film 12. Boron (B) is diffused in a concentration of $1 \times 10^{20}$ cm$^{-3}$ as the impurity into the Si single crystal film 12. The object of the present invention can be accomplished sufficiently even when the impurity is P, As or Sb.

A gate insulation film 15 consisting of about 40 nm-thick $SiO_2$ and a gate electrode 16 are disposed on the bottom surface of this Si single crystal substrate 12. Preferably, the gate electrode 16 permits the passage of light therethrough and has superconductivity at the liquid helium temperature. It is advisable to use about 100 nm-thick $BaPbBiO_3$ or about 20 nm-thick NbN film as the gate electrode 16. When the light 17 having a wavelength of 632.8 nm is incident to the photodetector from the bottom of the Si single crystal substrate 11 using an optical fiber 19 after cooling the detector to 4.2 K, the detector operates normally as the photodetector and the object of the present invention can be accomplished.

Figure 6:
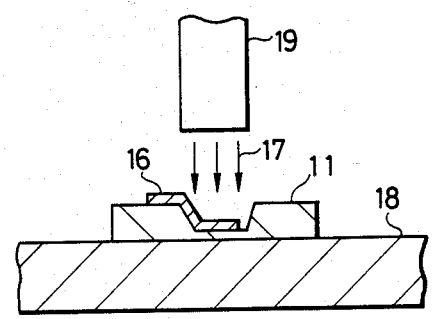
FIG. 6 is a schematic view showing the mode of use of the third embodiment.

When the photodetector is used as a circuit and packaged onto a chip carrier 18 in a so-called "face-down" arrangement as shown in FIG. 6, the light source can be disposed on the bottom surface side of the Si single crystal substrate 11 so that the light source such as the optical fiber 19 and the photodetector can be connected readily and the received signal can be transmitted to peripheral circuits at a high speed.

[Embodiment 4]

Figure 7:
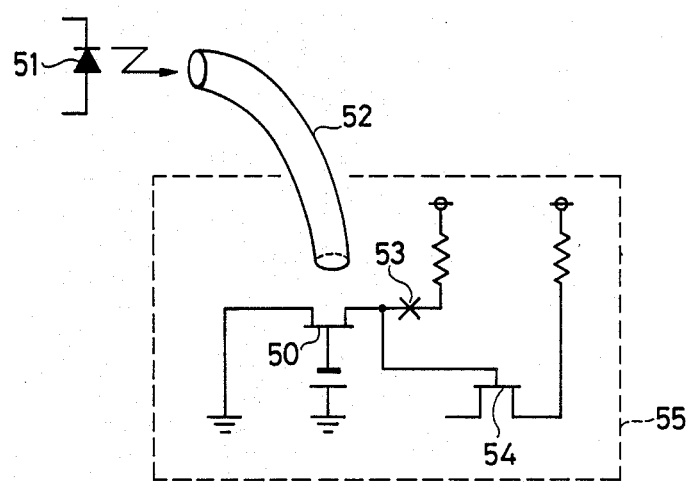
FIG. 7 is a circuit diagram useful for explaining a signal transmission system using the superconducting photodetector in accordance with a fourth embodiment of the present invention.

Next, the fourth embodiment of the present invention will be described with reference to FIG. 7. This drawing shows part of a signal transmitter for transmitting signals from a system which uses the superconducting photodetector of the present invention at room temperature to a system which is placed under a cryogenic temperature state. The optical signal from a light emitting diode (LED) 51 on the room temperature side passes through the optical fiber 52 and is guided to the superconducting photodetector 50 which is at the liquid helium temperature inside a cryogenic vessel 55. The optical signal is converted to the electric signal and transmitted to a digital signal processing circuit consisting of a Josephson device 53 or a superconducting transistor 54. Since the optical fiber 52 has low heat conductivity, it can greatly reduce the inflow of heat into the system under the low temperature state than the signal transmission system using a coaxial cable, so that the load of a cryogenic cooler and the operating cost of the system can be reduced or the cost of the cooler itself can be reduced and made compact in size.

Though this embodiment uses the light emitting diode as the light source, a semiconductor laser may be used in place of the light emitting diode. When the semiconductor laser is used as the light source, it is of course possible to transmit phase-modulated signals by using an optical fiber capable of preserving the polarization of light and disposing an analyzer on the superconducting photodetector.

A practical application example of this embodiment is a computer system, though it is not particularly limited. The embodiment can be utilized as signal transmission means between a system at room temperature and a system at cryogenic temperature or between two systems at cryogenic temperature. In order to speed up the circuit operation, it is preferred to monolithically integrate the superconducting photodetector 50, the Josephson device 53 and the superconducting transistor 54 shown in FIG. 7, and a light waveguide may be disposed in the integrated circuit for that purpose.

[Embodiment 5]

Figure 18:
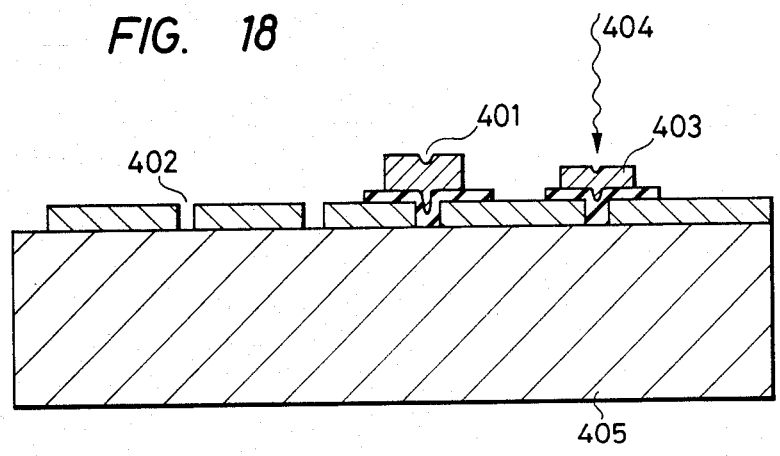
FIG. 18 is a sectional view showing the structure of the device shown in Embodiment 5 of the present invention.

The fifth embodiment of the present invention relates to an integrated superconducting photodetector obtained by integrating with another superconducting device. FIG. 18 is its sectional view. The drawing shows the construction wherein the superconducting Josephson device 402 and the superconducting photodetector 403 for detecting incident light 404 are integrated on the semiconductor substrate 405. The selection of the semiconductor and the superconductor is the same as that of the first embodiment. Due to this integration, signals can be processed at a high speed and a system having higher functions can be accomplished.

The following sixth and seventh embodiments of the present invention determine the film thickness of the superconducting electrodes in view of dependency of both the transmission factor of light and the superconducting critical temperature upon the film thickness. In order for the change of superconducting characteristics by the carriers excited by the light inside the semiconductor to occur efficiently, the light preferably transmits through the superconducting electrodes and is incident to the semiconductor. The transmission factor of the light becomes greater with a decreasing thickness of the superconducting electrodes, but the superconducting critical temperature degrades. On the other hand, in order to keep superconductivity of electrodes so that the device can operate in the liquid helium, the film thickness must be selected so that the superconducting critical temperature is above at least 4.2 K. Therefore, a superconducting photodetector having high sensitivity and suitable for large scale integration can be accomplished by selecting the thickness of the superconducting electrode so that the two requirements described above are satisfied at least the portion into which the light is incident.

Figure 10:
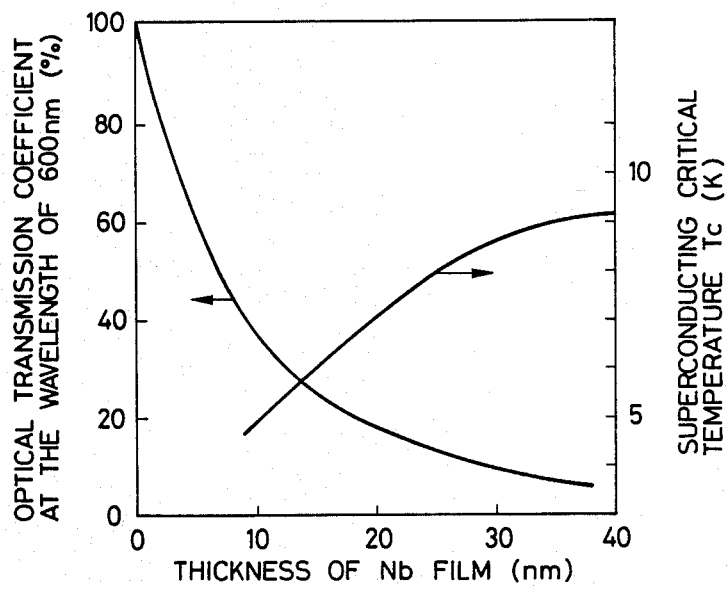
FIG. 10 is a diagram showing the relation between the thickness of an Nb film, its superconducting critical temperature and an optical transmission coefficient.
Figure 11:
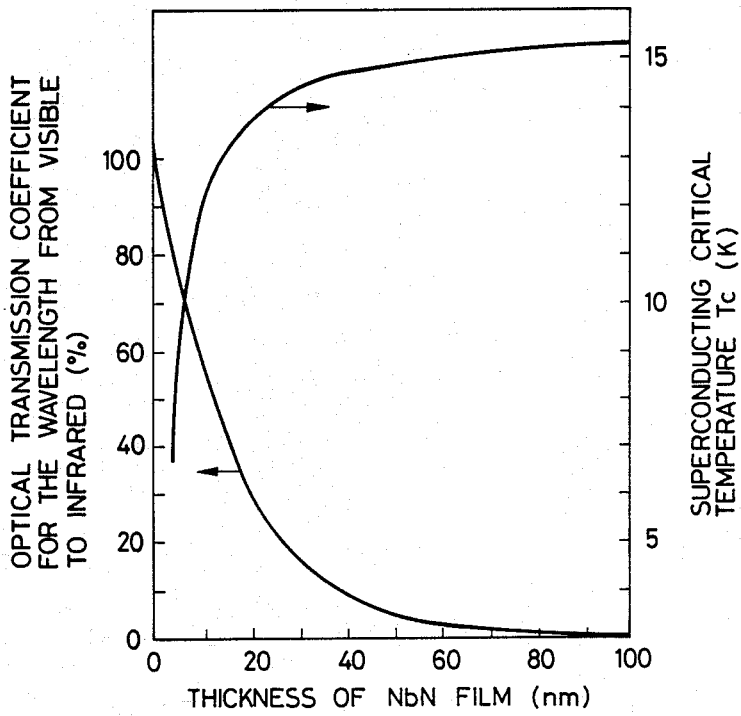
FIG. 11 is a diagram showing the relation between the thickness of an NbN film, its superconducting critical temperature and an optical transmission coefficient.

The electrodes having transparency for light and superconductivity at the liquid helium temperature can be obtained by selecting the thickness to the superconducting electrodes so that the transmission factor is at least 10% and the superconducting critical temperature is at least 4.2 K. In other words, the thickness is form 10 nm to 28 nm for Nb and from 5 to 35 nm for NbN as shown in FIGS. 10 and 11.

Figure 8:
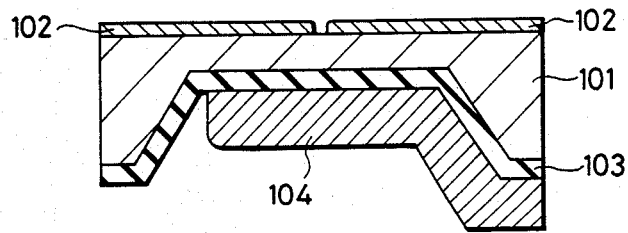
FIG. 8 is a sectional view of the superconducting photodetector in accordance with a sixth embodiment of the present invention.

The carrier concentration in the semiconductor increases when the two superconducting electrodes consisting of the thin film described above are diposed in such a manner as to face each other on the flat semiconductor as shown in FIG. 8 and light having sufficient wavelength and intensity to transmit through the thin film and to excite the semiconductor to generate the electron-positive hole pair is radiated. If the carrier concentration before the incidence of light is adjusted to about $1 \times 10^{16}$ to $1 \times 10^{18}$ cm$^{-3}$ by applying in advance a voltage to the control electrode, a superconducting current flows due to the superconducting proximity effect between the two electrodes. Therefore, switching can be accomplished due to the control of the superconducting current between the two electrodes by light. Furthermore, the sensitivity of the photodetector can be changed variously in connection with the wavelength and intensity of light by changing the film thickness of the superconducting electrodes and the kind and concentration of impurity in the semiconductor. Still alternatively, the sensitivity can be controlled by changing the applied voltage to the control electrode.

The circuit operation speed of a opto-electronic circuit can be improved by the application of the superconducting photodetector described above.

Next, the technical content given above will be described in further detail in Embodiments 6 and 7.

[Embodiment 6]

Figure 12:
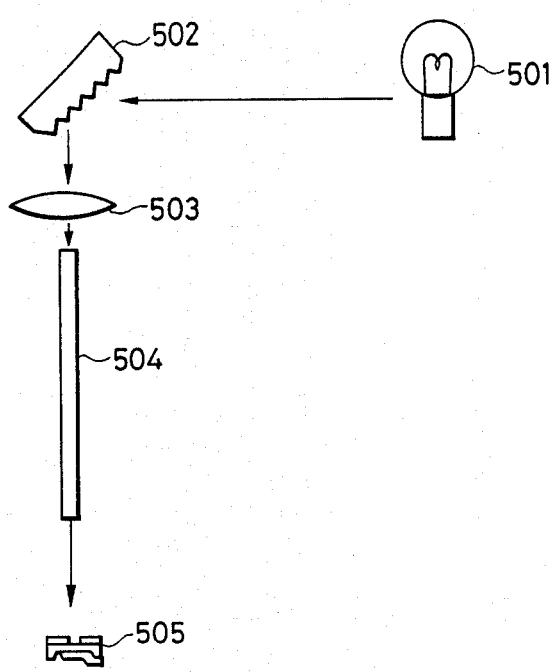
FIG. 12 is a schematic view showing the disposition of instruments for confirming the operation of the devices of Embodiment 6 and 7.

FIG. 8 is a sectional view showing part of the superconducting photodetector in accordance with this embodiment. Boron (B) is diffused in a concentration of $4\times10^{19}$ cm$^{-3}$ into a 2-inch Si substrate having (100) orientation and anisotropic etching is made from the bottom surface of the substrate only in the vertical direction to reduced the thickness of Si to 70 nm. Next, a 40 nm-thick SiO$_2$ gate insulation film 103 is formed by thermal oxidation, and a 0.7 μm-thick Al film is formed thereon by resistive heat evaporation and worked by Ar sputter etching to form a control electrode 104. A 15 nm-thick Nb film is formed on the top surface of the substrate by DC magnetron sputtering. The substrate is kept at a temperature of 25° C. in this case. Then, the Nb film is worked by electron beam lithography and reactive ion etching using an electron beam resist to form two transparent superconducting electrodes having a gap of 0.2 μm. Thus, the superconducting photodetector of the present invention can be fabricated. When the device is cooled to the liquid helium temperature and the light from a Al$\times$Ga$_{1-x}$As light emitting diode as a light source 501, which is passed through an optical grating 502 and has a wavelength of 650 nm, is exposed to the photodetector device 505 through a lens 503 and an optical fiber 504, the device is found to operate as a superconducting photodetector, as shown in FIG. 12.

[Embodiment 7]

Figure 9:
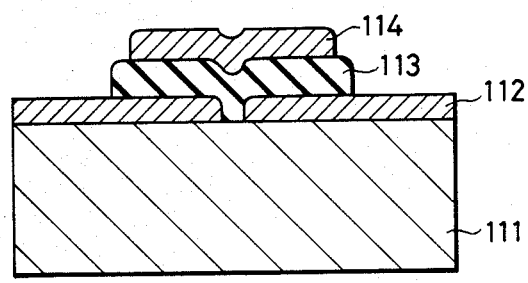
FIG. 9 is a sectional view showing the superconducting photodetector in accordance with a seventh embodiment of the present invention.

FIG. 9 is a sectional view showing part of the superconducting photodetector in accordance with the seventh embodiment of the present invention. Boron (B) is diffused into a semiconductor substrate 111 of 2-inch Si having (100) orientation at a concentration of $1\times10^{18}$ cm$^{-3}$, and a 50 nm-thick Nb film is deposited on the substrate surface by DC magnetron sputtering. The Nb film is then worked by reactive ion etching using a CF$_4$ gas to form two superconducting electrodes 112 having a gap of 0.2 μm. Next, a 100 nm-thick SiO$_2$ film is deposited by CVD and worked by reactive ion etching to form a transparent gate insulation film 113. Finally, a 15 nm-thick Nb film is formed by DC magnetron sputtering and worked by the lift-off method to form a transparent superconducting control electrode 114. There is thus formed the superconducting photodetector in accordance with the present invention. When the device is cooled to the liquid helium temperature and the light having a wavelength of 650 nm is exposed to the device 505 in the same way as in the sixth embodiment as shown in FIG. 12, the device is found to operate as the superconducting photodetector.

Though in this embodiment, the Nb film is used as the material of the superconductor, the same effect can be obtained when NbN is used in place of Nb.

Though this embodiment uses Si for the semiconductor substrate, it is possible to use Ge, InAs, InSb, GaAs, Al$\times$Ga$_{1-x}$As, InP, or the like, in place of Si. Similarly, the Al$\times$Ga$_{1-x}$As light emitting diode may be replaced by other light emitting diodes, semiconductor lasers, solid state lasers, gas lasers, or the like.

Next, the following eighth and ninth embodiments of the present invention propose the superconducting photodetector which can be operated by the exposure of weak light. This device has a layer disposed below a semiconductor layer so as to reflect the light transmitting through the semiconductor layer and to improve the absorption efficiency.

In other words, a layer, efficiently reflecting the light having a wavelength in which the semiconductor has a high absorption efficiency, is disposed below the semiconductor layer which is excited upon absorption of light, and moreover, this reflecting layer does not impede the operation of the device.

When the optical angle for light incident from a first medium to a second medium at the interface between the two kinds of media is i$_o$, the optical indexes of these first and second media are n$_1$ and n$_2$, respectively, and the optical absorption coefficient of the second medium is k, the reflection factor R of the light which is incident vertically is given by the following equation:

$$R = \frac{(n_1 - n_2)^2 + k^2}{(n_1 + n_2)^2 + k^2}$$

Figure 13:
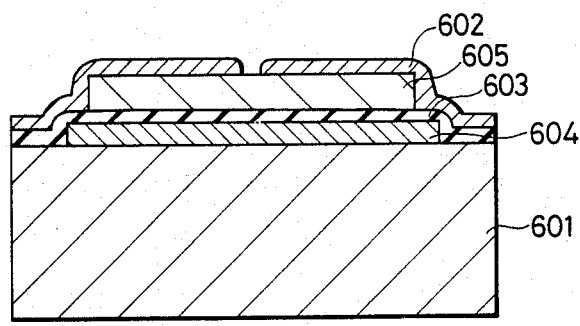
FIG. 13 is a sectional view showing the superconducting photodetector in accordance with an eighth embodiment of the present invention.

In the formula above, the sensitivity of the superconducting photodetector can be improved in the following way. First of all, n$_1$, n$_2$ and k are selected so that the relation $R \geq 0.5$ is satisfied for the light having a wavelength which excites the electrons and positive holes of the first medium, and then the combination of the first and second media and the film thickness of the first medium are selected so that the transmission factor of the first medium is at least 50%. Next, two electrodes 602 are disposed on a flat semiconductor layer 605 in such a manner as to face each other as shown in FIG. 13, and the light reflecting film layer 604 as the second medium is disposed at the rear of the semiconductor layer 605 through the insulation film 603 as the first medium. When the light having the wavelength satisfying the condition described above is incident, part of the incident light is reflected at the interface between the first and second media and increases effectively the carrier concentration in the semiconductor.

In this case, it is necessary that the existence of the light reflection layer does not prevent the superconducting coupling between the two superconducting electrodes. For example, when the impurity concentration of the semiconductor layer on the side of the reflection film is so high as to degenerate the semiconductor at the portion on the light reflection film at a cryogenic temperature (e.g. an impurity concentration of at least $1\times10^{19}$ cm$^{-3}$ when the semiconductor is Si), it is preferred that an insulation film be disposed between the semiconductor layer and the light reflection film. For, the electrons and positive holes in the light reflection film enter the semiconductor due to diffusion and act in such a manner as to shorten the life of the superconducting electron pairs that occur in the semiconductor layer due to the proximity effect, and the device does not stably in consequence.

Therefore, when the insulation film is not used, the impurity concentration of the semiconductor on the side of the reflection film layer is reduced (to about $1\times10^{16}\sim1\times10^{17}$ cm$^{-3}$) in order to prevent the carrier tunnel through the Schottky barrier between the light reflection film and the semiconductor. Though the description given above uses a metal for the light reflection film, the same effect can be brought forth when a p-n junction is formed between the semiconductor and the light reflection film as a second semiconductor when the second semiconductor is used.

[Embodiment 8]

The eighth embodiment of the present invention will be described in detail. FIG. 13 is a sectional view showing part of the superconducting photodetector in accordance with the eighth embodiment. A film consisting of 50 nm-thick Al is formed by sputtering on an Si semiconductor substrate 601 with which the device is integrated, and is worked by Ar sputter etching to form a light reflection film 604. An insulation film 603 consisting of 30 nm-thick $SiO_2$ is then formed by CVD and a semiconductor layer 605 consisting of a 300 nm-thick InSB film is then formed by sputtering. Si as an impurity is added to the semiconductor layer 605 in a concentration of $5 \times 10^{16}$ cm$^{-3}$ at the time of sputtering. Finally, a 15 nm-thick Nb film is deposited by DC magnetron sputtering and worked by electron beam lithography using an electron beam resist and reactive ion etching to form two superconducting electrodes 602 having a gap of 200 nm between them.

There is thus obtained the superconducting photodetector of this embodiment. When this device is cooled to the liquid helium temperature and the light from a light source 701 consisting of a photodiode, which light is converged by a lens 702, passed through an optical grating 703 and has a wavelength of 650 nm, is incident to the device 705 through an optical fiber 704, the device is found to operate as the photodetector.

Though this embodiment uses the Nb film as the superconducting electrodes, the $SiO_2$ film as the insulation film and the Al film as the reflection film, it is also possible to use NbN, Pb alloys, MoN, $Nb_3Si$, $Nb_3Al$ or the like for the superconducting material, SiO, $Si_3N_4$, or the like for the insulation film and Cu, Ag, or the like for the reflection film.

[Embodiment 9]

Figure 14:
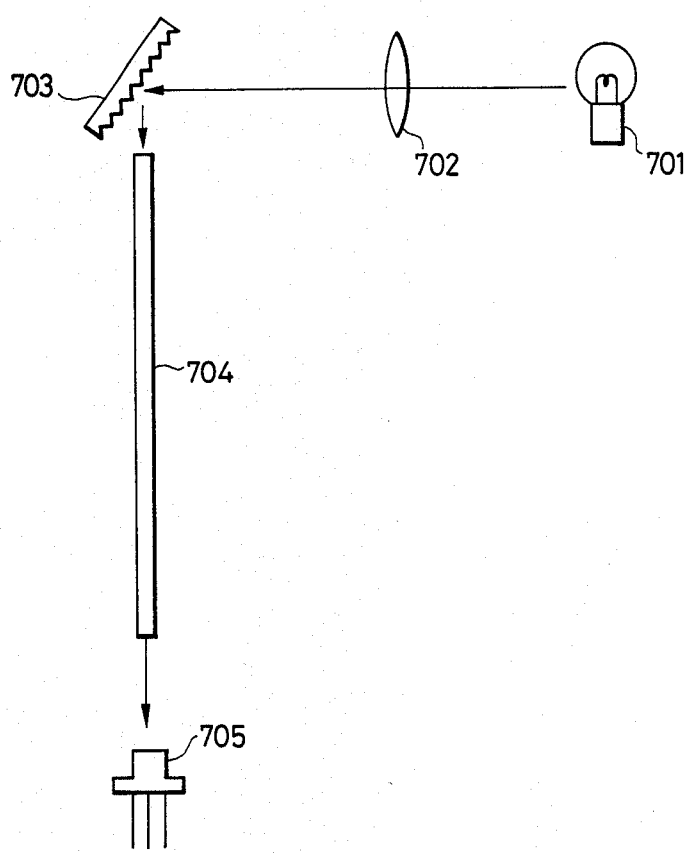
FIG. 14 is a schematic view showing the disposition of instruments for confirming the operation of the devices of Embodiments 8 and 9.
Figure 15:
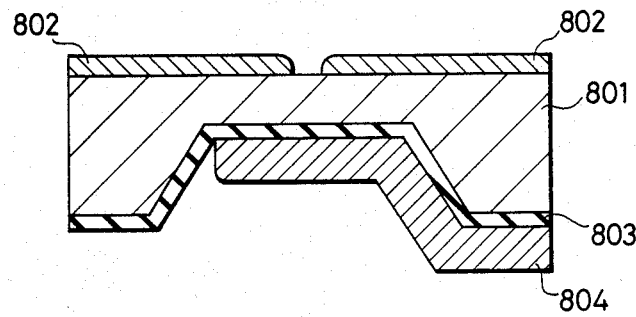
FIG. 15 is a structural sectional view of the superconducting device in accordance with a ninth embodiment of the present invention.

FIG. 15 is a sectional view showing part of the superconducting photodetector of the ninth embodiment of the present invention. Boron (B) is diffused in a concentration of $5 \times 10^{26}$ cm$^{-3}$ into a 2-inch Si semiconductor substrate 801 having a (100) orientation, and anisotropic etching is made from the bottom surface of the substrate only in a vertical direction to set the thickness of Si to 70 nm. Next, an insulation film 803 consisting of 20 nm-thick $SiO_2$ is formed by thermal oxidation, and a 700 nm-thick Al film is formed thereon by resistive heat evaporation and worked by Ar sputter etching to form a reflecting control electrode 804. A 15 nm-thick Nb film is then formed on the surface by DC magnetron sputtering, and worked by electron beam lithography using an electron beam resist and reactive ion etching to form superconducting electrodes 802 having a gap of 200 nm between their opposed portions. There is thus obtained the superconducting photodetector of this embodiment. When the device is cooled to the liquid helium temperature and the light from a photodiode 701, which is converged by a lens 702, passed through an optical grating 703 and has a wavelength of 650 nm, is exposed to the device using an optical fiber 704 as shown in FIG. 14, the device is found to operate as the superconducting photodetector.

Though this embodiment uses Nb as the material for the superconducting electrodes, Si for the semiconductor, $SiO_2$ for the insulation film and Al for the reflecting control electrode, it is also possible to use NbN, Pb alloys, MoN, $Nb_3Si$, $Nb_3Al$, or the like for the semiconductor, InAs, InP, InSb, GaAs, GaP, CdS for the like for the semiconductor, SiO, $Si_3N_4$ or the like for the insulation film and Cu, Ag, or the like for the reflection film.

In accordance with the eighth and ninth embodiments of the present invention, the light incident to the semiconductor layer is reflected by the mirror layer disposed below the semiconductor layer so that the absorption of light by the semiconductor is made effectively and the carrier concentration necessary for causing the superconducting current to flow is obtained easily. Accordingly, these embodiments can propose a method of improving the sensitivity of the superconducting photodetector.

[Embodiment 10]

Next, the tenth embodiment of the present invention will be described with reference to FIGS. 16 and 17. This embodiment uses two-dimensional electron gas occurring on the heterojunction of a semiconductor as the carrier in the semiconductor. Though the embodiment uses an electron donor layer 905 consisting of $Al_xGa_{1-x}As$ (x=0.3) single crystal and a channel layer 904 consisting of a GaAs single crystal, they are not particularly limited thereto, so that any combination capable of generating the two-dimensional electron gas such as $Al_yGa_{1-y}Sb$ (y=0.15) with GaSb can also be employed.

Figure 16:
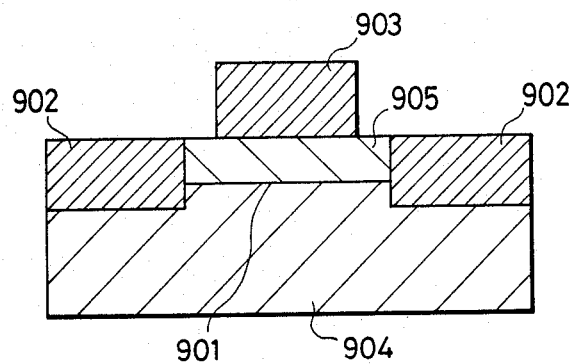
FIG. 16 is a structural sectional view of the superconducting photodetector in accordance with a tenth embodiment of the present invention.
Figure 17:
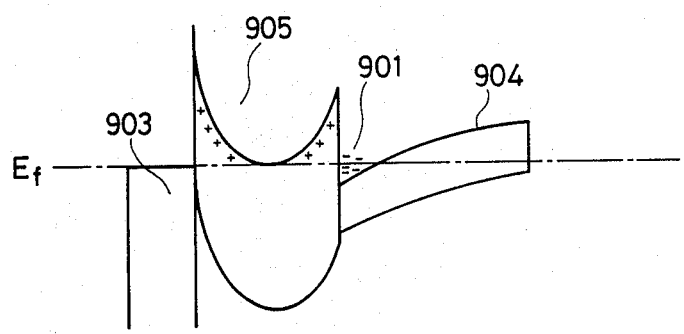
FIG. 17 is an energy band diagram in the proximity of the channel of the superconducting photodetector in Embodiment 10 of the present invention.

FIG. 16 shows the structure of the superconducting photodetector of this embodiment and FIG. 17 shows the energy band at the semiconductor channel portion 901. When the light is radiated to the semiconductor, the excited carrier accumulates as the two-dimensional electron gas on the heterojunction surface and its density increases. Since mobility of the carrier increases at this time, too, the maximum quantity of the superconducting current flowing between the two superconducting electrodes increases. In this manner, superconducting coupling between the two superconducting electrodes 902 can be controlled by radiating the light to the semiconductor. In this case, the wavelength of the light to be radiated to the semiconductor is such that the photon energy is equal to, or greater than, the energy gap of the semiconductor. In this manner, the object of the present invention can be accomplished even when the heterojunction is used as the semiconductors. In this case, too, the electrical characteristics of the device and hence the operating condition, can be set in accordance with the voltage applied to the gate electrode 903.

It is understood by those skilled in the art that the foregoing description is of referred embodiments of the invention disclosed herein and that various changes and modifications may be made in the invention without departing from the spirit and scope thereof.

What is claimed is:

1. A superconducting photodetector comprising:
 a semiconductor substrate;
 at least two superconducting electrodes formed on a first surface of said semiconductor substrate spaced apart from one another wherein a superconducting weak coupling through said semiconductor substrate is formed between said spaced apart electrodes;
 an electrode means for accumulating a predetermined quantity of carriers in said semiconductor substrate between said superconducting electrodes to cause a critical superconducting current to flow between said superconducting electrodes; and means for radiating light to said semiconductor substrate between said superconducting electrodes so as to vary the number of carriers between said superconducting electrodes by excitation and to control superconducting current flowing between said superconducting electrodes.

2. A superconducting photodetector according to claim 1, wherein said electrode means for accumulating carriers is a metal electrode disposed on said first surface of said semiconductor substrate through an insulating film between said superconducting electrodes.

3. A superconducting photodetector according to claim 1, wherein the impurity concentration of said semiconductor substrate is higher at portions where said semiconductor substrate comes into contact with said superconducting electrodes.

4. A superconducting photodetector according to claim 1, wherein said electrode means has a thickness such that light radiated by said radiating means acts as a signal and can transmit through said electrode means.

5. A superconducting photodetector according to claim 2, wherein said metal electrode consists of a film of Nb or NbN.

6. A superconducting photodetector according to claim 5, wherein said metal electrode is a Nb film having a thickness from 10 to 28 nm.

7. A superconducting photodetector according to claim 5, wherein said metal electrode is a NbN film having a thickness from 5 to 35 nm.

8. A superconducting photodetector according to claim 1, wherein said superconducting electrodes consist of films of at least one of Nb and NbN.

9. A superconducting photodetector according to claim 8, wherein said superconducting electrodes consist of a 10 to 28 nm-thick Nb film or a 5 to 35 nm-thick NbN film.

10. A superconducting photodetector according to claim 1, wherein said electrode means for accumulating carriers is a metal electrode formed through an insulation film on a second surface of said semiconductor substrate opposite said first surface.

11. A superconducting photodetector according to claim 1, wherein said electrode means for accumulating carriers is a light reflection layer formed on the opposite side to an incidence surface of said semiconductor substrate.

12. A superconducting photodetector according to claim 11, wherein an insulation film is disposed between said semiconductor substrate and said light reflection layer.

13. A superconducting photodetector according to claim 11, wherein said light reflection layer is made of a metal.

14. A superconducting photodetector according to claim 11, wherein said light reflection layer consists of a semiconductor layer.

15. A superconducting photodetector according to claim 1, wherein said semiconductor is made of two kinds of different semiconductors.

16. A semiconductor photodetector according to claim 1, wherein light is radiated by said radiating means to said first surface of said semiconductor substrate.

17. A semiconductor photodetector according to claim 1, wherein light is radiated by said radiating means to a second surface of said semiconductor substrate opposite said first surface.

18. A semiconductor photodetector according to claim 10, wherein light is radiated by said radiating means to said first surface of said semiconductor substrate.

19. A semiconductor photodetector according to claim 10, wherein light is radiated by said radiating means to said second surface of said semiconductor substrate.

20. A semiconductor photodetector according to claim 10, wherein said metal electrode has thickness such that light radiated by said radiating means acts as a signal and can transmit through said metal electrode.

21. A semiconductor photodetector according to claim 10, wherein said metal electrode consists of a film of Nb or NbN.

22. A semiconductor photodetector according to claim 21, wherein said metal electrode is a Nb film having a thickness from 10 to 28 nm.

23. A semiconductor photodetector according to claim 21, wherein said metal electrode is a NbN film having a thickness from 5 to 35 nm.

24. A semiconductor photodetector according to claim 1, wherein said superconducting electrodes are space apart a distance of 5 to 20 times the coherence length in said semiconductor.

* * * * *